(12) United States Patent
Alberdi Celaya et al.

(10) Patent No.: US 10,348,046 B2
(45) Date of Patent: Jul. 9, 2019

(54) INSULATED HIGH-VOLTAGE ADAPTER

(71) Applicant: Ormazabal Protection & Automation, S.L.U., Igorre (Vizcaya) (ES)

(72) Inventors: Alazne Alberdi Celaya, Amorebieta (ES); Luis Lopez Cano, Amorebieta (ES); Juan Antonio Sanchez Ruiz, Igorre (ES)

(73) Assignee: ORMAZABAL PROTECTION & AUTOMATION, S.L.U., Igorre (Vizcaya) (ES)

( * ) Notice: Subject to any disclaimer, the term of this patent is extended or adjusted under 35 U.S.C. 154(b) by 155 days.

(21) Appl. No.: 15/516,555

(22) PCT Filed: Oct. 1, 2014

(86) PCT No.: PCT/ES2014/070746
§ 371 (c)(1),
(2) Date: Apr. 3, 2017

(87) PCT Pub. No.: WO2016/050994
PCT Pub. Date: Apr. 7, 2016

(65) Prior Publication Data
US 2018/0269639 A1    Sep. 20, 2018

(51) Int. Cl.
*G01R 15/14* (2006.01)
*H01R 31/06* (2006.01)
(Continued)

(52) U.S. Cl.
CPC .............. *H01R 31/06* (2013.01); *G01R 15/14* (2013.01); *H01B 17/56* (2013.01); *H01R 13/207* (2013.01);
(Continued)

(58) Field of Classification Search
CPC ...... G01R 15/14; G01R 1/0416; H01R 13/53; H01R 13/639; H01R 31/06; H01B 17/56; H02G 1/14
(Continued)

(56) References Cited

U.S. PATENT DOCUMENTS 3,657,650 A * 4/1972 Arndt .................. G01R 19/145
                                                                174/18
4,709,339 A * 11/1987 Fernandes .............. G01K 1/024
                                                                324/127
(Continued)

FOREIGN PATENT DOCUMENTS

EP    1309098 A1    5/2003
EP    2194628 A1    6/2010
(Continued)

*Primary Examiner* — Patrick Assouad
*Assistant Examiner* — Demetrius R Pretlow
(74) *Attorney, Agent, or Firm* — Hayes Soloway PC

(57) ABSTRACT

The present invention relates to a high-voltage insulated adaptor (100) for application at a point of connection between a piece of high-voltage electrical equipment (6) and at least one measuring, control and protecting means (8), which allows connecting the measuring, control and protecting means (8) with at least one bar (10) of the main set of bars of the high-voltage electrical equipment (6), regardless of the type of element (5) for electrical connection existing in the high-voltage electrical equipment (6), where the adaptor (100) additionally comprises at least one anchoring means (9) securing the installation of the assembly formed by the insulating body (1) and the measuring, control and protecting means (8) on the bushing (5) for electrical connection corresponding to at least one bar (10) of the main set of bars of the high-voltage electrical equipment (6).

13 Claims, 4 Drawing Sheets

(51) Int. Cl.
  *H01R 13/53* (2006.01)
  *H01B 17/56* (2006.01)
  *H01R 13/207* (2006.01)
  *H01R 13/639* (2006.01)

(52) U.S. Cl.
  CPC ........... *H01R 13/53* (2013.01); *H01R 13/639* (2013.01); *H01R 2201/20* (2013.01)

(58) Field of Classification Search
  USPC .......................................... 324/126; 439/181
  See application file for complete search history.

(56) References Cited

U.S. PATENT DOCUMENTS

| | | | | |
|---|---|---|---|---|
| 4,886,980 | A * | 12/1989 | Fernandes | G01R 15/142 307/64 |
| 4,999,571 | A * | 3/1991 | Ishiko | G01R 15/142 324/117 R |
| 6,677,743 | B1 * | 1/2004 | Coolidge | G01R 15/16 324/126 |
| 7,158,012 | B2 * | 1/2007 | Wiesman | H04B 3/56 324/126 |
| 7,369,045 | B2 * | 5/2008 | Hansen | H02J 13/0075 333/24 R |
| 7,786,894 | B2 * | 8/2010 | Polk | H04L 12/66 324/764.01 |
| 9,366,688 | B2 * | 6/2016 | Miller | G01P 5/10 |
| 9,697,724 | B2 * | 7/2017 | Miller | G08C 17/02 |
| 9,739,804 | B2 * | 8/2017 | Busemann | G01R 19/0084 |
| 9,784,766 | B2 * | 10/2017 | Lindsey | G01R 31/085 |
| 9,843,176 | B2 * | 12/2017 | Gibson | H02G 1/04 |
| 2002/0171433 | A1 * | 11/2002 | Watanabe | G01R 15/16 324/539 |
| 2010/0151735 | A1 * | 6/2010 | Crutcher | G01D 4/00 439/620.01 |
| 2011/0025342 | A1 | 2/2011 | Siebens | |
| 2011/0062944 | A1 | 3/2011 | Sorensen | |
| 2011/0095750 | A1 | 4/2011 | Harlev et al. | |

FOREIGN PATENT DOCUMENTS

| | | |
|---|---|---|
| EP | 2253963 A1 | 11/2010 |
| ES | 1075987 U | 1/2012 |
| WO | 02080308 A2 | 10/2002 |
| WO | 03107560 A1 | 12/2003 |

* cited by examiner

INSULATED HIGH-VOLTAGE ADAPTER

OBJECT OF THE INVENTION

The present invention relates to the field of electric energy distribution and transformation, and more specifically to an adaptor for application at a point of connection between high-voltage electrical equipment and at least one measuring, control and protecting means. Said adaptor allows connecting the measuring, control and protecting means with at least one bar of the main set of bars of the high-voltage electrical equipment, regardless of the type of element for electrical connection existing in the high-voltage electrical equipment, keeping the same element for electrical connection existing until now.

BACKGROUND OF THE INVENTION

High-voltage electrical equipment or switchgear used today in electric energy distribution facilities for operating and/or protecting power grid comprise different compartments, such as the cable compartment, for example, which can receive connection cables or provide them with an outlet towards other distribution facilities.

Measuring, control and protecting means such as, for example, voltage sensors, voltage transformers, means for receiving/transmitting signals through PLC, means for detecting partial discharges, current sensors, etc., can also be installed in the cable compartment of a piece of electrical equipment.

These measuring, control and protecting means such as, for example, means supplying voltage and intensity values, such as toroidal inductive sensing elements for measuring intensity, and resistive/capacitive sensing elements for measuring voltage, are installed in the connection between the aforementioned cables and the high-voltage electrical equipment by means of connectors (for example, T-connectors) installed in situ, since the cables are previously installed. The captured signals are conditioned and processed in an electronic data acquisition system for protection, measurement and/or control. Therefore, in a distribution facility with several pieces of high-voltage electrical equipment installed therein, each of these pieces of electrical equipment comprises measuring, control and protecting means installed in the cable compartment, the signals captured by each of the measuring, control and protecting means being received by electronic relays which are integrated with the high-voltage electrical equipment itself. Therefore, each piece of high-voltage electrical equipment is generally provided with measuring, control and protecting means, as well as an electronic relay.

The measuring, control and protecting means are installed in situ once the connectors of the cables are installed, i.e., the measuring, control and protecting means are installed, set and checked on site, so errors in installing the means due to incorrect wiring of the ground grids, polarities, etc., would not occur. Likewise, each of the pieces of electrical equipment comprises its own electronic relay associated with its own measuring, control and protecting means, which involves the need of using at least one measuring, control and protecting means for each piece of electrical equipment arranged in a distribution facility, which leads to large pieces of electrical equipment and ultimately to a larger space required for the distribution facility, more extensive wiring, as well as higher costs.

In this sense, some examples of patents relating to such connections with T-connectors installed in the cable compartment can be mentioned:

Patent Application US20110025342A1 relates to a T-connector which, on one hand, can be connected to a bushing of a piece of electrical equipment through the first open end thereof. Likewise, the connector can be connected through the second open end thereof to a piece of equipment or said second open end can be insulated by means of a cap. The third open end is configured for receiving a power cable and a voltage sensing point is also arranged on this third end of the connector.

International Patent Application WO02080308A2 also relates to a connection system by means of a T-connector which allows sensing the intensity and voltage at the same point of connection between the cable and the electrical equipment. The system comprises a toroidal inductive sensing element for measuring intensity, a resistive sensing element for measuring voltage, a shielded connector, a fixed connection base (bushing of the electrical equipment) and a piece of electronic signal acquisition equipment. The intensity sensing element is supported on the fixed connection base, and the voltage sensing element is integrated in the separable T-connector, specifically at one of the open ends thereof, without changing the characteristics of the high-voltage connection.

Other examples include International Patent Application WO03107560A1, Utility Model ES1075987Y and Patent EP1309098B1, which also relate to solutions for the connection of measuring, control and protecting means in the cable compartment of a piece of high-voltage electrical equipment.

Patent EP2253963B1 relates to a solution for the connection of measuring, control and protecting means with the main set of bars of a piece of high-voltage electrical equipment. It relates to a specific connection with an adapted connector which, as a result of several connection interfaces, allows establishing an electrical connection by contact between planar surfaces. Such specific connection is developed to be used in sets of bars having a planar configuration, i.e., a non-standard configuration. Therefore, the object of said patent EP2253963 B1 is to simplify the connection of an electric magnitude measuring device with an element of a power line of the types including a connecting bar, cable or terminal, the connection interface of which is planar and compressible. Such connection therefore has the drawback of being able to be used only in facilities with sets of bars and connecting elements with a specific non-standard configuration, which makes the distribution facility more costly.

DESCRIPTION OF THE INVENTION

The present invention solves the aforementioned drawbacks by providing a high-voltage insulated adapter envisaged for being used at a point of connection between a piece of high-voltage electrical equipment and at least one measuring, control and protecting means, allowing a connection with a high degree of protection (insulated and shielded), as well as a connection which can supply voltage and intensity values at the point of connection.

Specifically, the adaptor of the invention is installed between the electrical equipment and the measuring, control and protecting means, regardless of the type of connecting element existing in the high-voltage electrical equipment, being able to be used with both male and female bushings for electrical connection arranged in at least one side wall of the high-voltage electrical equipment. The adaptor of the present invention therefore allows connecting at least one measuring, control and protecting means with a standard bushing for electrical connection corresponding to at least one bar of the main set of bars of a piece of high-voltage electrical equipment, only one measuring, control and protecting means being necessary for the entire distribution facility, since the voltage measured in said point is common for all the pieces of high-voltage electrical equipment forming the distribution facility, said means being installed in one of the pieces of high-voltage electrical equipment. Problems relating to space in the facilities, wirings, costs, etc., are thus minimized The only measuring, control and protecting means existing in the installation is associated with each of the electronic relays installed in each piece of high-voltage electrical equipment, and it is installed, set and checked in the factory, so errors in installing the means due to incorrect wiring of the ground grids, polarities, etc., are prevented.

The adaptor comprises at least one insulating body externally provided at least partially with a first conductive layer and internally provided at least partially with a second conductive layer, comprising a first connecting end which can be coupled to the bushing for electrical connection of the high-voltage electrical equipment and at least a second connecting end allowing the electrical connection of the at least one measuring, control and protecting means. The first connecting end is housed in the bushing for electrical connection and internally comprises at least one conductive part in correspondence with at least one conductive terminal of the high-voltage electrical equipment. On the side opposite that of the first connecting end, the insulating body comprises the second connecting end which can house the measuring, control and protecting means in correspondence with the conductive part. The first outer conductive layer is grounded, such that the electric field is uniformly distributed between the second inner conductive layer and the first outer conductive layer of the insulating body, thus preventing corona effect and possible partial discharges that may occur. The adaptor also internally comprises at least one conducting means which is of the same potential as the conductive part, thus assuring control over the electric field.

The assembly formed by the insulating body and the measuring, control and protecting means is coupled to the high-voltage electrical equipment through at least one anchoring means comprising at least one anchoring plate fixed on the side of the high-voltage electrical equipment, and at least one rod which is fixed at one end to the anchoring plate and at the other end to at least one stop through a tightening element.

The possibility that the adaptor may comprise a third connecting end allowing the electrical connection of at least one measuring, control and protecting means or, in the absence thereof, an insulating cap, has been contemplated.

The possibility that the adaptor may comprise at least one toroidal inductive sensing element assembled around the insulating body for measuring intensity has also been contemplated.

The measuring, control and protecting means used can comprise at least one voltage sensor, a voltage transformer, means for receiving/transmitting signals through PLC, means for detecting partial discharges, etc.

The assembly formed by the adaptor and the measuring, control and protecting means and/or the insulating cap is installed in the high-voltage electrical equipment which is located in the first position of the facility or in the last position, being protected inside a shell in both cases.

DESCRIPTION OF THE DRAWINGS

To complement the description that is being made and for the purpose of aiding to better understand the features of the invention according to a preferred practical embodiment thereof, a set of drawings is attached as an integral part of said description in which the following is depicted in an illustrative and non-limiting character.

PREFERRED EMBODIMENT OF THE INVENTION

Several preferred embodiments are described below with reference to the drawings mentioned above, without it limiting or reducing the scope of protection of the present invention.

Figure 1:
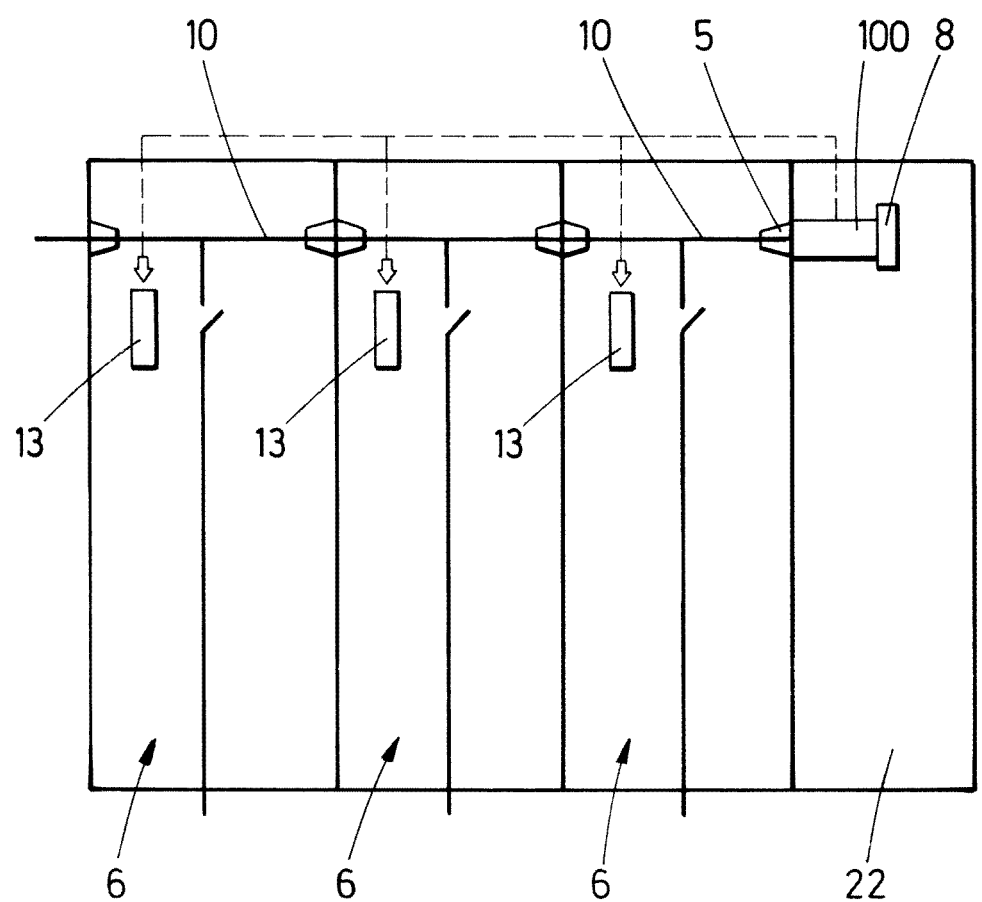
FIG. 1 shows the one-line electrical diagram of a distribution facility which has a plurality of pieces of high-voltage electrical equipment with their respective integrated electronic relays which are associated with the measuring, control and protecting means installed inside a shell.
Figure 2:
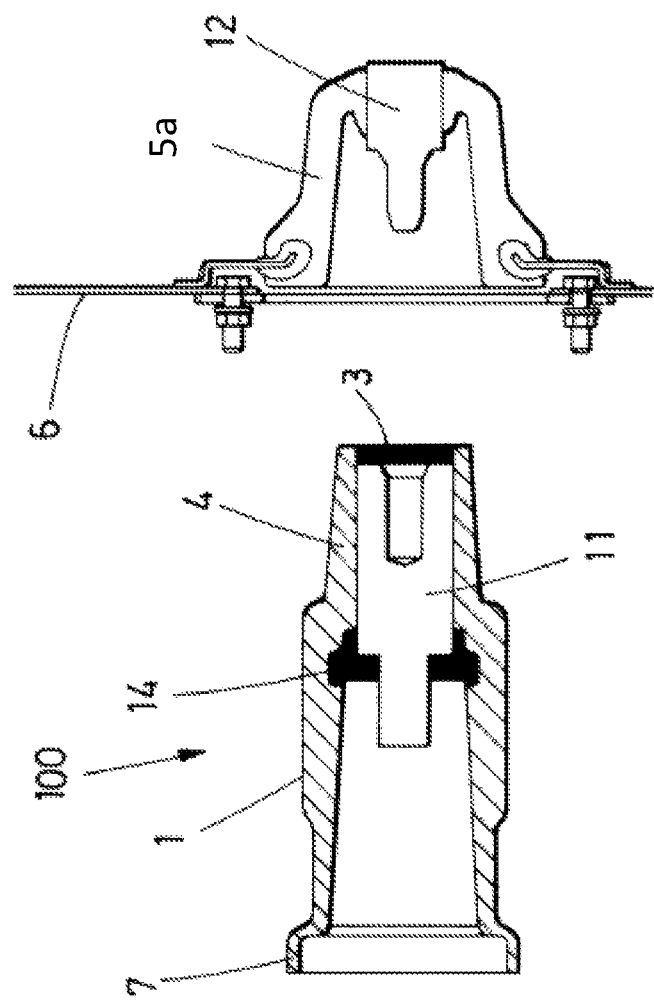
FIG. 2 shows an exploded view of a phase of the grid where the high-voltage insulated adapter according to a first preferred embodiment is seen.
Figure 3:
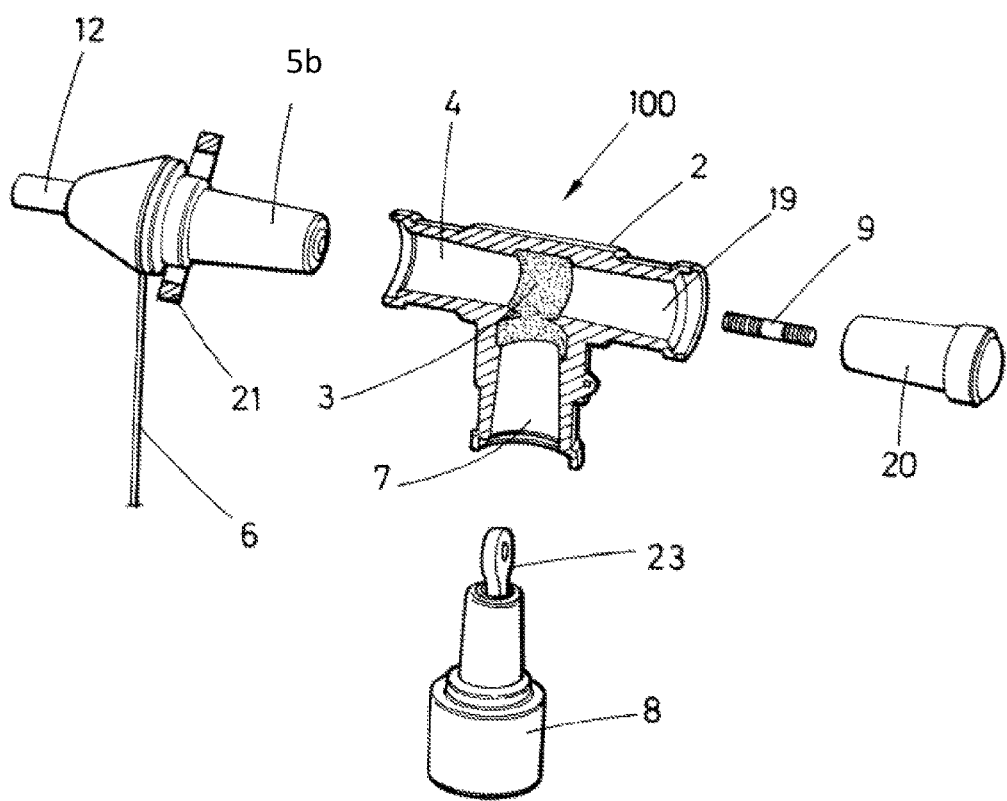
FIG. 3 shows another exploded perspective view of a phase of the grid where the insulated adaptor of the invention according to a second preferred embodiment is seen.
Figure 4:
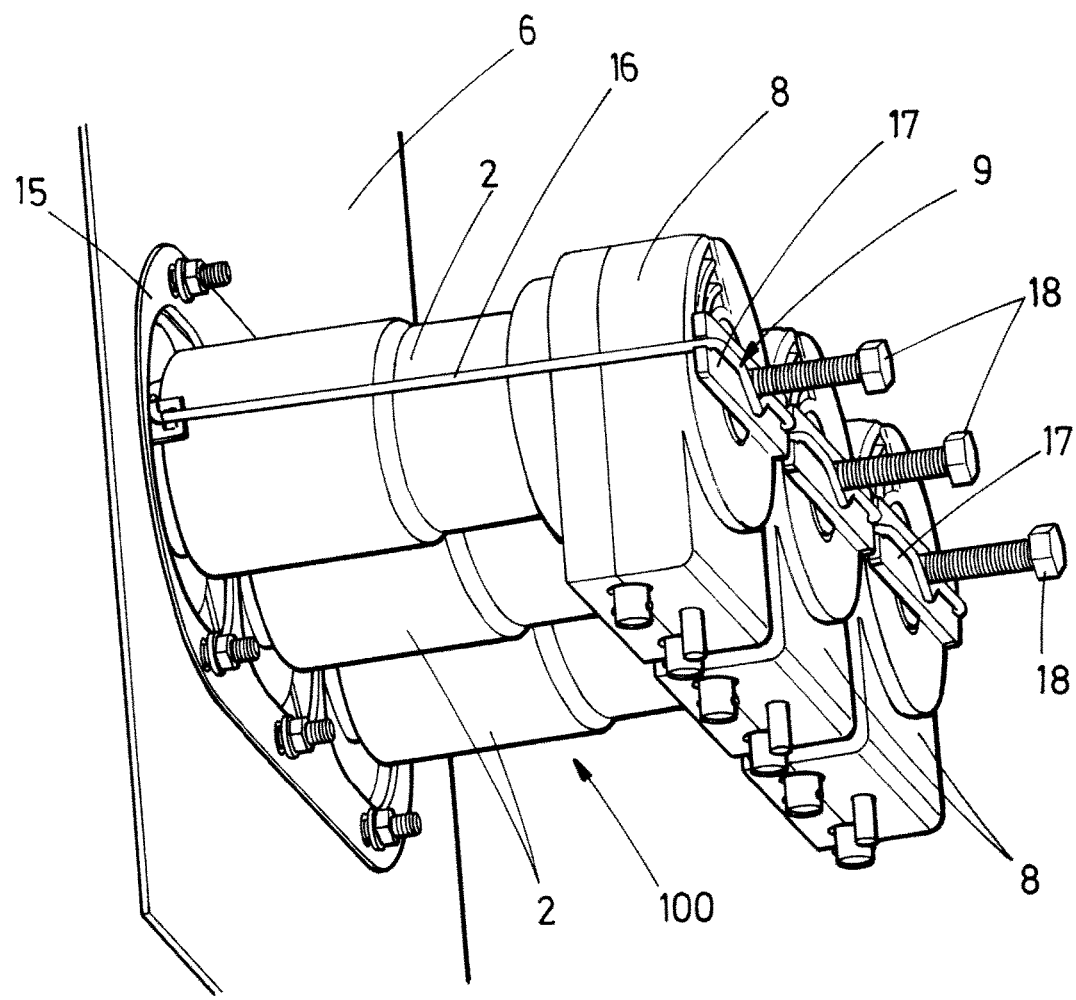
FIG. 4 shows a perspective view of the assembly of the measuring, control and protecting means on the high-voltage electrical equipment by anchoring means.

FIGS. 2, 3 and 4 show the high-voltage insulated adaptor (100) which is installed between a measuring, control and protecting means (8) and a piece of high-voltage electrical equipment (6), which allows making an insulated and shielded connection, as well as supplying voltage and intensity values at the point of connection, said connection being made by means of connecting the adaptor (100) with at least one bushing (5) for electrical connection corresponding to at least one bar (10) of the main set of bars of the high-voltage electrical equipment (6), as shown in FIG. 1.

Therefore, the adaptor (100) allows installing the measuring, control and protecting means (8) in at least one side wall of the high-voltage electrical equipment (6), regardless of the type of bushing (5) for electrical connection existing in the electrical equipment (6), i.e., a male bushing (5b), see FIG. 3, or a female bushing (5a), see FIG. 2.

As can be seen in FIG. 1, the measuring, control and protecting means (8) of the installation is associated with each of the electronic relays (13) installed in each of the pieces of high-voltage electrical equipment (6), where said measuring, control and protecting means (8) is installed, set and checked in the factory.

According to a first embodiment of the invention shown in FIGS. 2 and 4, the adaptor (100) comprises at least one insulating body (1) externally provided at least partially with a first conductive layer (2) and internally provided at least partially with a second conductive layer (3), comprising a first connecting end (4) which can be coupled to the bushing (5a) for electrical connection of the high-voltage electrical equipment (6) and at least a second connecting end (7) allowing the electrical connection of the measuring, control and protecting means (8). As can be seen in the embodiment of FIG. 2, the first connecting end (4) is housed in the female bushing (5a) for electrical connection and internally comprises at least one conductive part (11) in correspondence with at least one conductive terminal (12) of the high-voltage electrical equipment (6). The insulating body (1) further comprises the second connecting end (7) which can house the measuring, control and protecting means (8) in correspondence with the conductive part (11).

According to a second embodiment of the invention shown in FIG. 3, the adaptor (100) further comprises a third connecting end (19) allowing the electrical connection of at least one measuring, control and protecting means (8) or, in the absence thereof, an insulating cap (20).

In both cases, in the both first and second preferred embodiments, the first outer conductive layer (2) is grounded, such that the electric field is uniformly distributed between the second inner conductive layer (3) and the first outer conductive layer (2) of the insulating body (1). The adaptor (100) also internally comprises at least one conducting means (14) shown in FIG. 2 which is of the same potential as the conductive part (11), thus assuring control over the electric field.

The adaptor (100) comprises anchoring means (9) which, in the case of the first embodiment of the invention as shown in FIG. 4, comprises at least one anchoring plate (15) fixed to the side wall of the high-voltage electrical equipment (6), and at least one rod (16) which is fixed at one end to the anchoring plate (15) and at the other end to at least one stop (17) through a tightening element (18).

As seen in FIG. 3, the anchoring means (9) comprising a threaded stud going through a conductive terminal (23) of the measuring, control and protecting means (8) and being screwed on the bushing (5b) for electrical connection, in this case a male bushing, has been contemplated in the second preferred embodiment of the invention.

The measuring, control and protecting means (8) used can comprise at least one voltage sensor, a voltage transformer, means for receiving/transmitting signals through PLC, means for detecting partial discharges, etc.

The possibility that the adaptor (100) may comprise at least one toroidal inductive sensing element (21) intended for being assembled around the insulating body (1) of the adaptor (100) for measuring intensity, as shown in FIG. 3, has also been contemplated.

Finally, it must be pointed out that the assembly formed by the adaptor (100) and the measuring, control and protecting means (8) and/or the insulating cap (20) is installed in the high-voltage electrical equipment (6) which is located in the first position of the installation or in the last position, being protected inside a shell (22) in both cases, as shown in FIG. 1.

The invention claimed is:

1. High-voltage insulated adaptor for application at a point of connection between a piece of high-voltage electrical equipment and at least one measuring, control and protecting means, and comprising:

at least one insulating body externally provided at least partially with a first conductive layer and internally provided at least partially with a second conductive layer, where said insulating body comprises a first connecting end which is couplable to a bushing for electrical connection of the high-voltage electrical equipment and at least a second connecting end allowing the electrical connection of the at least one measuring, control and protecting means, characterized in that the high-voltage insulated adaptor comprises at least one anchoring means securing the installation of the assembly formed by the insulating body and the measuring, control and protecting means on the bushing for electrical connection corresponding to at least one bar of the main set of bars of the high-voltage electrical equipment.

2. Adaptor according to claim 1, characterized in that the anchoring means comprises at least one anchoring plate fixed on the side of the high-voltage electrical equipment, at least one rod which is fixed at one end to the anchoring plate and at the other end to at least one stop through a tightening element.

3. Adaptor according to claim 1, characterized in that the anchoring means comprises a threaded stud configured for going through a conductive terminal of the measuring, control and protecting means and for being screwed on a male bushing for electrical connection.

4. Adaptor according to claim 1, characterized in that the first connecting end is couplable to a female bushing for electrical connection located in at least one side wall of the high-voltage electrical equipment.

5. Adaptor according to claim 1, characterized in that the first connecting end is couplable to a male bushing for electrical connection located in at least one side wall of the high-voltage electrical equipment.

6. Adaptor according to claim 4, characterized in that the first connecting end is housed in the female bushing for electrical connection and internally comprises at least one conductive part in correspondence with at least one conductive terminal of the high-voltage electrical equipment.

7. Adaptor according to claim 6, characterized in that it internally comprises at least one conducting means which is of the same potential as the conductive part, thus assuring control over the electric field.

8. Adaptor according to claim 7, characterized in that on the side opposite that of the first connecting end, it comprises the second connecting end where the measuring, control and protecting means is housed in correspondence with the conductive part.

9. Adaptor according to claim 5, characterized in that it comprises a third connecting end allowing the electrical connection of at least one measuring, control and protecting means or an insulating cap.

10. Adaptor according to claim 1, characterized in that the measuring, control and protecting means comprises at least one voltage sensor, at least one voltage transformer, means for receiving/transmitting signals through PLC or means for detecting partial discharges.

11. Adaptor according to claim 1, characterized in that it comprises at least one toroidal inductive sensing element assembled around the insulating body for measuring intensity.

12. Adaptor according to claim 1, characterized in that the assembly formed by the adaptor and the measuring, control and protecting means and/or the insulating cap is protected inside a shell.

13. Adaptor according to claim 1, characterized in that the first conductive layer is grounded.

* * * * *